(12) United States Patent
Chen et al.

(10) Patent No.: US 10,869,384 B2
(45) Date of Patent: Dec. 15, 2020

(54) CIRCUIT BOARD HEAT DISSIPATION ASSEMBLY

(71) Applicant: GIGA-BYTE TECHNOLOGY CO., LTD., New Taipei (TW)

(72) Inventors: Hung-Cheng Chen, New Taipei (TW); Tse-Hsien Liao, New Taipei (TW)

(73) Assignee: GIGA-BYTE TECHNOLOGY CO., LTD., New Taipei (TW)

( * ) Notice: Subject to any disclaimer, the term of this patent is extended or adjusted under 35 U.S.C. 154(b) by 0 days.

(21) Appl. No.: 16/809,583

(22) Filed: Mar. 5, 2020

(65) Prior Publication Data

US 2020/0296819 A1     Sep. 17, 2020

(30) Foreign Application Priority Data

Mar. 12, 2019  (TW) .............................. 108202967 U

(51) Int. Cl.
   *H05K 1/02*          (2006.01)

(52) U.S. Cl.
   CPC ......... *H05K 1/0203* (2013.01); *H05K 1/0201* (2013.01); *H05K 1/0204* (2013.01); *H05K 1/0209* (2013.01); *H05K 2201/064* (2013.01); *H05K 2201/066* (2013.01); *H05K 2201/10393* (2013.01); *H05K 2201/2018* (2013.01)

(58) Field of Classification Search
   CPC ........... H05K 1/0203; H05K 2201/066; H05K 2201/064; H05K 2201/2018; H05K 2201/10393; H05K 1/0201; H05K 1/0204; H05K 7/20536; H01L 23/427; H01L 23/3672; H01L 2924/0002; H01L 23/4093
   See application file for complete search history.

(56) References Cited

U.S. PATENT DOCUMENTS

| | | | |
|---|---|---|---|
| 7,477,515 B2 * | 1/2009 | Tsai | H01L 23/427 257/E23.088 |
| 9,405,335 B1 * | 8/2016 | Boilard | B23P 15/26 |
| 9,429,370 B1 * | 8/2016 | Thomsen | H05K 5/04 |
| 2004/0182552 A1 * | 9/2004 | Kubo | H01L 23/427 165/104.33 |
| 2004/0264142 A1 * | 12/2004 | Mejia | H01L 23/427 361/719 |
| 2006/0056155 A1 * | 3/2006 | Lee | G06F 1/20 361/700 |
| 2007/0091577 A1 * | 4/2007 | Maehara | H05K 1/0206 361/719 |

(Continued)

*Primary Examiner* — Steven T Sawyer
(74) *Attorney, Agent, or Firm* — Idea Intellectual Limited; Margaret A. Burke; Sam T. Yip

(57) ABSTRACT

A circuit board heat dissipation assembly includes a circuit board, a heat sink, a metal back plate, a heat pipe, and a pressing member. The circuit board has a front side and a rear side, and the front side has at least one heat generating area. The heat sink is disposed in the heat generating area. The metal back plate is disposed at a spacing from the rear side of the circuit board. The heat pipe has a first end, a bend segment, and a second end. The first end is connected to the heat sink. The second end is in contact with the metal back plate. The bend segment connects the first end and the second end at a side edge of the circuit board. The pressing member is fixed on the metal back plate and presses the second end onto the metal back plate.

9 Claims, 6 Drawing Sheets

(56) References Cited

U.S. PATENT DOCUMENTS

| | | | |
|---|---|---|---|
| 2007/0263355 A1* | 11/2007 | Yu | H01L 23/467 |
| | | | 361/700 |
| 2008/0062649 A1* | 3/2008 | Leng | H01L 23/427 |
| | | | 361/700 |
| 2009/0009969 A1* | 1/2009 | Chu | H05K 7/20536 |
| | | | 361/700 |
| 2010/0258276 A1* | 10/2010 | Chen | H01L 23/427 |
| | | | 165/104.26 |
| 2013/0070419 A1* | 3/2013 | Yang | H01L 23/4093 |
| | | | 361/700 |

* cited by examiner

CIRCUIT BOARD HEAT DISSIPATION ASSEMBLY

CROSS-REFERENCE TO RELATED APPLICATION

This non-provisional application claims priority under 35 U.S.C. § 119(a) to Patent Application No. 108202967 filed in Taiwan, R.O.C. on Mar. 12, 2019, the entire contents of which are hereby incorporated by reference.

BACKGROUND

Technical Field

This disclosure relates to heat dissipation configurations of circuit boards, and in particular, to a circuit board heat dissipation assembly.

Related Art

A circuit board, particularly a computer motherboard, is provided with electronic chips running at high power. The electronic chips require a heat sink to dissipate heat, to avoid failures of the electronic chips, and generated high heat further affects other electronic elements.

A metal element is additionally installed at the back of an existing computer motherboard, which increases mechanical strength of the motherboard and facilitates the installation of the heat sink. The metal element can provide an additional air cooling surface. However, the metal element is not in direct contact with the electronic chips needing heat dissipation. The heat dissipation can only be performed by using bolts and copper posts to conduct the heat to the heat sink, and the reinforcing effect on the heat dissipation is not obvious.

There is also a design in which a heat pipe is used to connect the heat sink and the metal element. However, the heat pipe usually needs to be divided into a plurality of segments and then are connected by using other metal blocks, so that the heat sinks and the metal elements on different surfaces can be connected. Alternatively, the motherboard needs to be provided with an opening hole to allow the bent heat pipe to pass through. The disposing of the heat pipe passing through the opening hole limits the shape of the heat pipe, and otherwise the heat pipe cannot pass through the opening hole to connect the heat sink and the metal element. Moreover, a problem that heat conductivity is affected due to excessively high thermal contact resistance tends to occur to the connection between the heat pipe and the metal element.

SUMMARY

In view of the foregoing problem, this disclosure provides a circuit board heat dissipation assembly including a circuit board, a heat sink, a metal back plate, a heat pipe, and a pressing member.

The circuit board includes a front side and a rear side. The front side includes at least one heat generating area. The heat sink is disposed in the heat generating area. The metal back plate is disposed at a spacing from the rear side of the circuit board. The heat pipe includes a first end, a bend segment, and a second end. The first end is connected to the heat sink. The second end is in contact with the metal back plate. The bend segment connects the first end and the second end at a side edge of the circuit board. The pressing member is fixed on the metal back plate and presses the second end onto the metal back plate.

In at least one embodiment, the circuit board heat dissipation assembly further includes a plurality of connecting columns. The circuit board and the metal back plate are connected through the plurality of connecting columns.

In at least one embodiment, the metal back plate covers the entire rear side of the circuit board.

In at least one embodiment, the metal back plate covers a part of the rear side of the circuit board.

In at least one embodiment, a projection of the metal back plate on the circuit board overlaps a projection of the heat sink on the circuit board.

In at least one embodiment, the second end is flat and includes a first contact surface and a second contact surface respectively in contact with the pressing member and the metal back plate.

In at least one embodiment, a heat-conducting medium is disposed between the first contact surface and the pressing member, and/or a heat-conducting medium is disposed between the second contact surface and the metal back plate.

In at least one embodiment, the pressing member and the second end are located between the metal back plate and the circuit board.

In at least one embodiment, the pressing member includes a fixed portion and a pressing portion extending from the fixed portion. The fixed portion is fixed on the metal back plate. The pressing portion presses the second end.

In at least one embodiment, a thickness of the fixed portion is greater than the thickness of the pressing portion. A pressing space exists between the pressing portion and the metal back plate. The second end is located in the pressing space.

In at least one embodiment, the circuit board includes a notch groove located at the side edge of the circuit board. The notch groove is open at the side edge. The bend segment passes through the notch groove.

After the heat sink absorbs heat in the heat generating area, in addition to dissipating the heat by using the heat dissipation function, heat energy can also be transferred to the metal back plate through the heat pipe, so that the metal back plate can make use of a large surface area for air cooling, to strengthen the heat dissipation effect. In addition, the installation process can be simplified by using the pressing member to connect the metal back plate and the heat pipe, and the reliability of the pressing member combined to the metal back plate is improved.

BRIEF DESCRIPTION OF THE DRAWINGS

The disclosure will become more fully understood from the detailed description given herein below for illustration only, and thus not limitative of the disclosure, wherein.

DETAILED DESCRIPTION

Figure 1:
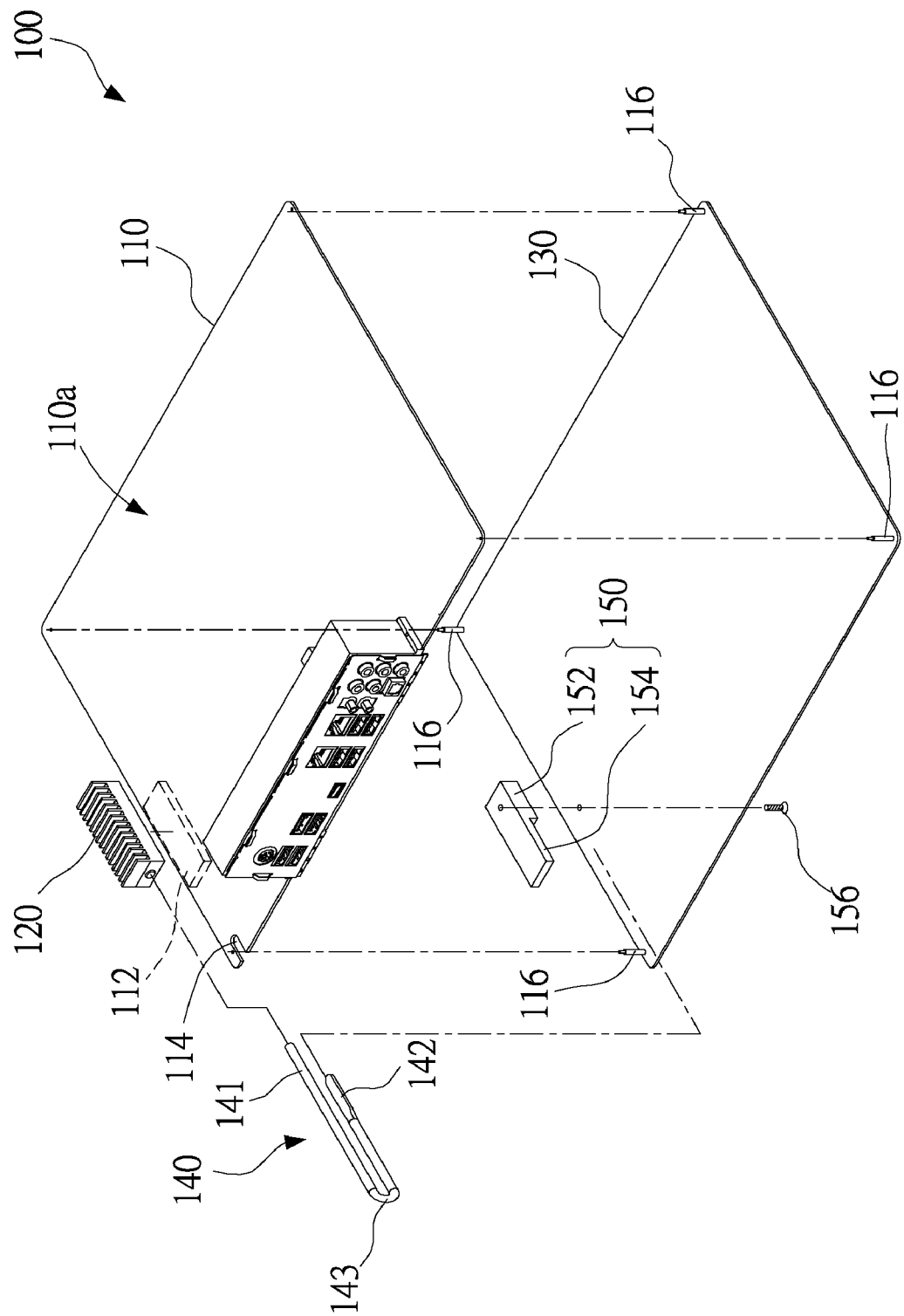
FIG. 1 is a three-dimensional exploded view according to an embodiment of this disclosure.
Figure 2:
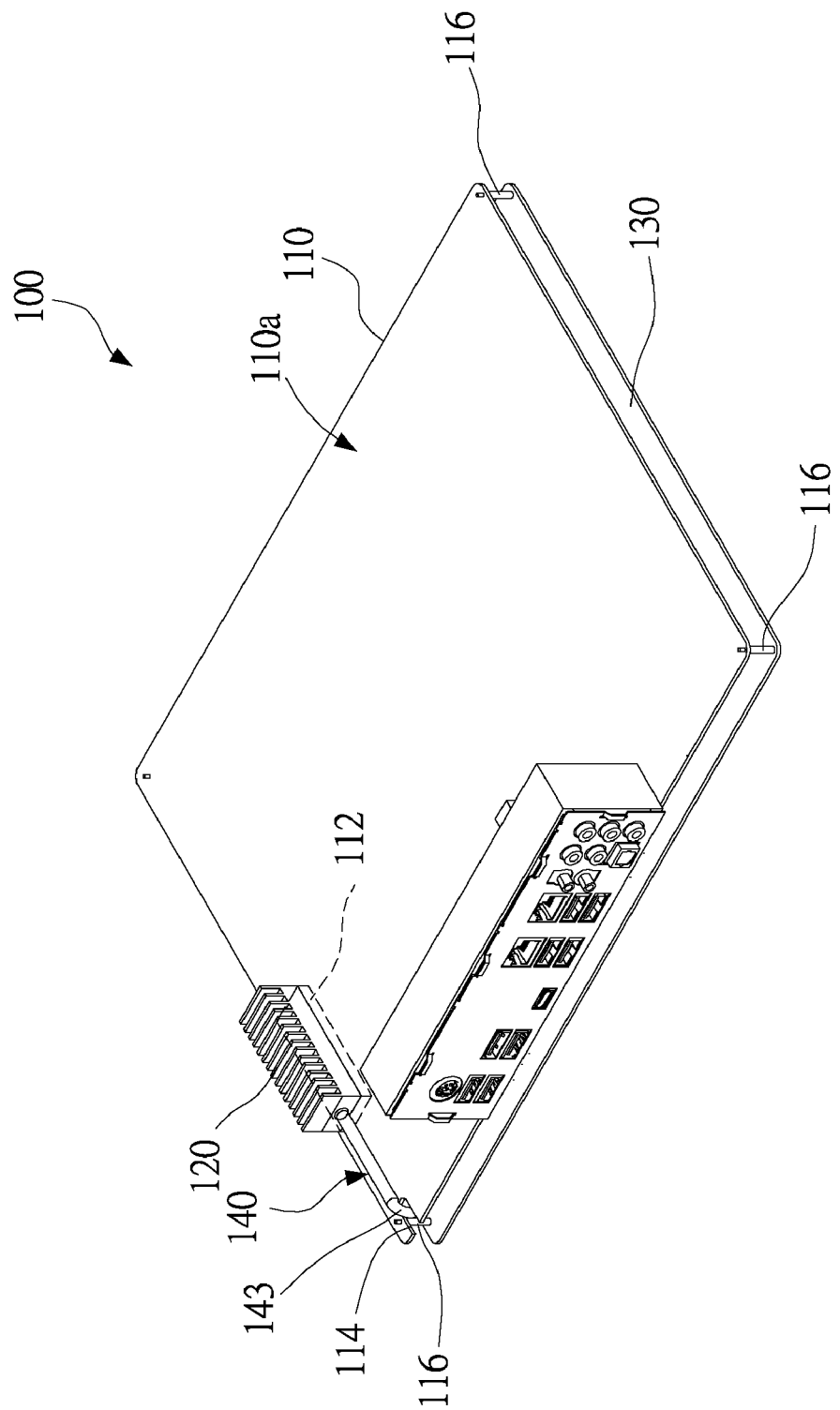
FIG. 2 is a three-dimensional diagram according to an embodiment of this disclosure.
Figure 3:
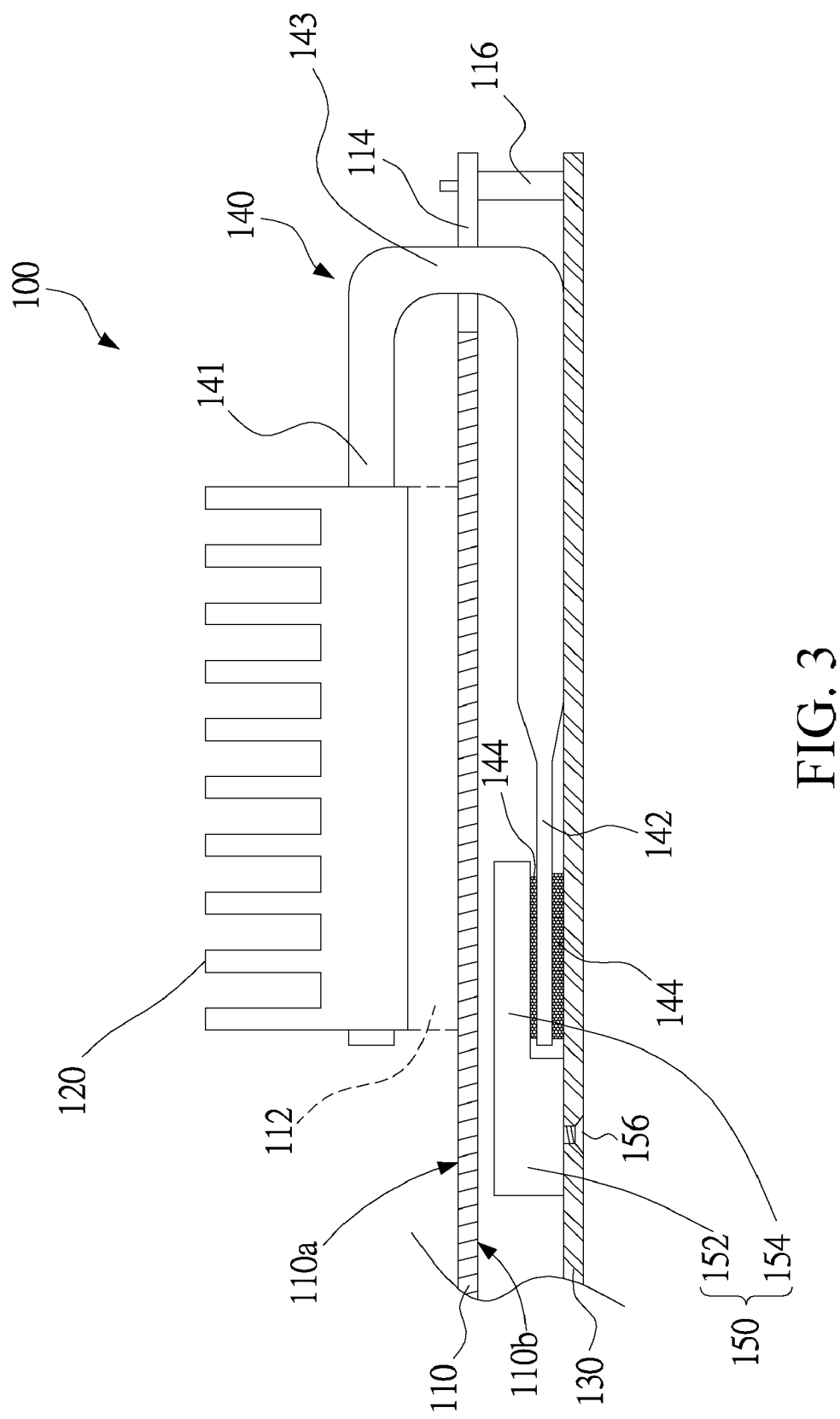
FIG. 3 is a sectional view according to an embodiment of this disclosure.

Referring to FIG. 1, FIG. 2, and FIG. 3, a circuit board heat dissipation assembly 100 according to an embodiment of this disclosure includes a circuit board 110, a heat sink 120, a metal back plate 130, a heat pipe 140, and a pressing member 150.

As shown in FIG. 1 and FIG. 3, the circuit board 110 includes a front side 110a and a rear side 110b. The front side 110a includes at least one heat generating area 112. The heat generating area 112 is used for disposing a heat generating element, for example, an electronic chip running at high power. The electronic chip includes but is not limited to a central processing unit (CPU), a graphics processing unit (GPU), a system logic chip, or an on-board memory module. The circuit board 110 may be a motherboard, but is not excluded as a circuit with another use.

As shown in FIG. 1, FIG. 2, and FIG. 3, the heat sink 120 is disposed in the heat generating area 112 on the front side 110a and is configured to contact the heat generating element, to absorb heat emitted by the heat generating element and cool the heat generating element. A form of the heat sink 120 is not limited, which may be a fin-type heat sink including a plurality of fins, or may be a water cooling head of a water cooling system. The metal back plate 130 is disposed corresponding to the rear side 110b of the circuit board 110, and is disposed at a spacing from the rear side 110b of the circuit board 110. The metal back plate 130 is usually parallel to the circuit board 110. In this embodiment of this disclosure, the circuit board heat dissipation assembly 100 further includes a plurality of connecting columns 116, for example, copper columns. The circuit board 110 and the metal back plate 130 are connected through the plurality of connecting columns 116, so that the metal back plate 130 is disposed at a spacing from the rear side 110b.

As shown in FIG. 1, FIG. 2, and FIG. 3, the heat pipe 140 includes a first end 141, a bend segment 143, and a second end 142. The first end 141 is connected to the heat sink 120. The second end 142 is in contact with the metal back plate 130. The bend segment 143 connects the first end 141 and the second end 142 at a side edge of the circuit board 110.

As shown in FIG. 1, the heat pipe 140 formed by combining the first end 141, the bend segment 143, and the second end 142 in a U-shape. The bend segment 143 bypasses the side edge of circuit board 110, so that the first end 141 and the second end 142 are respectively located on the front side 110a and the rear side 110b of the circuit board 110. The heat sink 120 is provided with a through hole. An aperture of the through hole is slightly less than an outer diameter of the first end 141, so that the first end 141 may be tightly combined to the heat sink 120 in a tight fit manner after inserted into the through hole. The heat sink 120 may also be provided with a clamping mechanism to clamp the first end 141 in a clamping manner.

Figure 4:
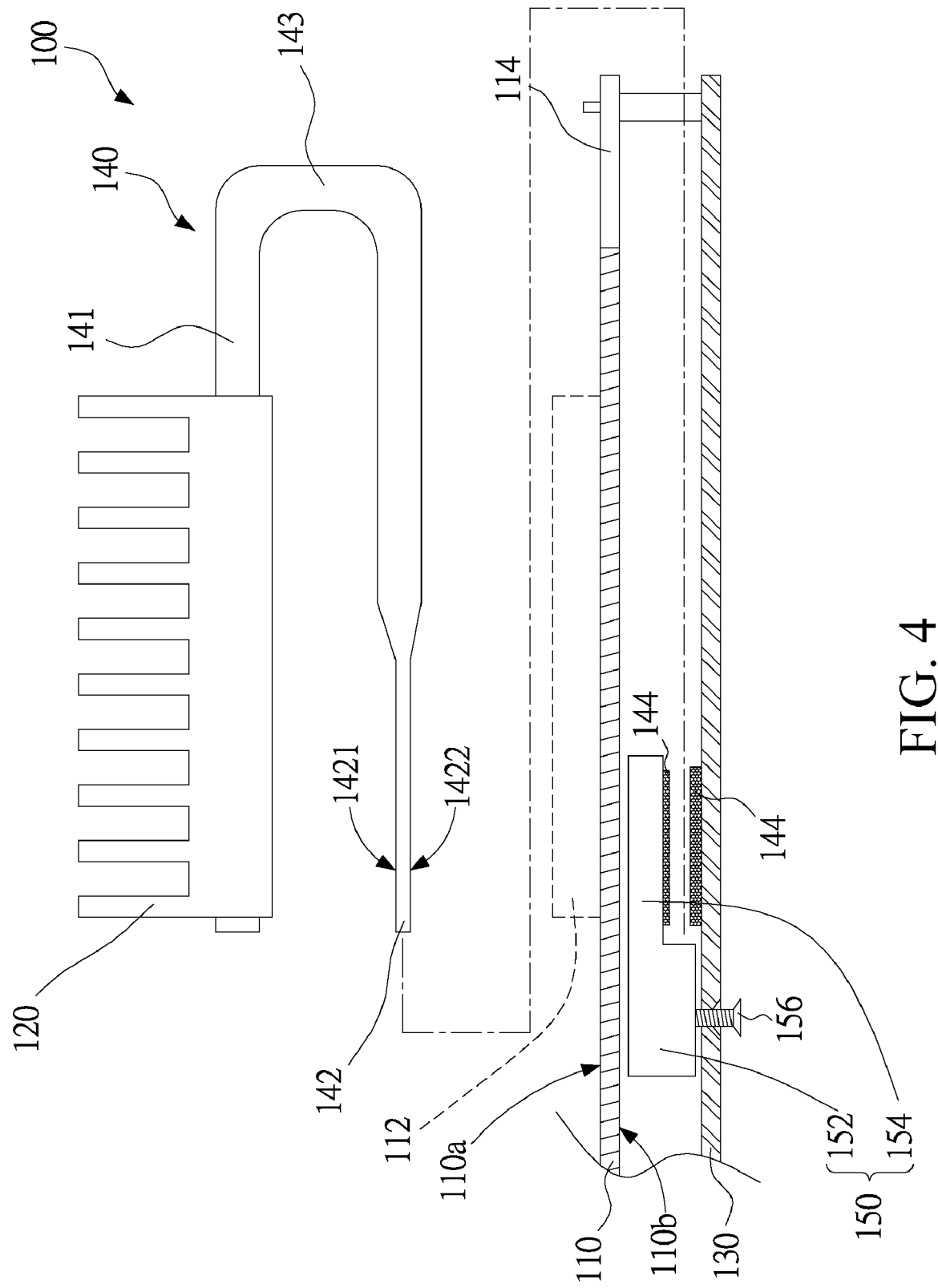
FIG. 4 is a sectional exploded view according to an embodiment of this disclosure.

As shown in FIG. 4, the heat pipe 140 may be first combined to the heat sink 120, so that an opening of the U-shape is toward the side edge of the circuit board 110. The heat sink 120 is placed in the heat generating area 112 and the second end 142 moves toward the metal back plate 130, so that the second end 142 is located between the metal back plate 130 and the circuit board 110.

As shown in FIG. 1, FIG. 3, and FIG. 4, the pressing member 150 is located between the metal back plate 130 and the circuit board 110. The second end 142 of the heat pipe 140 is flat and includes a first contact surface 1421 and a second contact surface 1422 respectively in contact with the pressing member 150 and the metal back plate 130. Moreover, a heat-conducting medium 144 is disposed between the first contact surface 1421 and the pressing member 150, and/or a heat-conducting medium 144 is disposed between the second contact surface 1422 and the metal back plate 130. The heat-conducting medium 144 includes but is not limited to a heat-conducting adhesive tape or heat-conducting paste.

As shown in FIG. 1, FIG. 3, and FIG. 4, the pressing member 150 includes a fixed portion 152 and a pressing portion 154 extending from the fixed portion 152. The fixed portion 152 is configured to be fixed on the metal back plate 130. The pressing portion 154 is configured to press the second end 142. A thickness of the fixed portion 152 is greater than a thickness of the pressing portion 154. A pressing space exists between the pressing portion 154 and the metal back plate 130. The second end 142 is located in the pressing space.

As shown in FIG. 4, during installation, a bolt 156 may pass through the metal back plate 130 from the outer surface of the metal back plate 130 and be loosely screwed into the fixed portion 152 of the pressing member 150 in advance, so as to combine the pressing member 150 to the metal back plate 130. The bolt 156 is temporarily loosely screwed, to enlarge the pressing space between the pressing portion 154 and the metal back plate 130. Next, the second end 142 is inserted between the pressing portion 154 and the metal back plate 130. The fixed portion 152 of the pressing member 150 may be fixed on the metal back plate 130 after the bolt 156 is tightly screwed. The pressing portion 154 presses the second end 142 onto the metal back plate 130, so as to form a heat conductivity path between the heat pipe 140 and the metal back plate 130. The pressing member 150 and the second end 142 are preferably located between the metal back plate 130 and the circuit board 110, so as to keep an outer side surface of the metal back plate 130 from protruding. This does not exclude that the pressing member 150 and the second end 142 are located on the outer side surface of the metal back plate 130.

In addition, as shown in FIG. 1, FIG. 2, FIG. 3, and FIG. 4, the circuit board 110 includes a notch groove 114, located at the side edge of the circuit board 110. The notch groove 114 is open at the side edge. During installation, the bend segment 143 may move horizontally into the notch groove 114, so that the bend segment 143 passes through the notch groove 114 without making the bend segment 143 protrude beyond the side edge. Therefore, the bend segment 143 may be arranged at any edge of the circuit board 110, for example, located next to a connection port assembly, so that a location of the bend segment 143 is not limited due to a protrusion structure. Moreover, the heat pipe 140 is more easily to be installed in the notch groove 114 than in a single hole, and lengths of the first end 141 and the second end 142 of the heat pipe 140 are not limited. If the U-shaped heat pipe 140 passes through the single hole, the lengths of the first end 141 and the second end 142 are definitely limited, and otherwise during assembly, the heat pipe 140 definitely cannot pass through the single hole and form a configuration that the first end 141 and the second end 142 are respectively disposed on two side surfaces of the circuit board 110.

In this embodiment, a shape of the metal back plate 130 is roughly the same as a shape of the circuit board 110, that is, the metal back plate 130 covers the entire rear side 110b of the circuit board 110. A large metal back plate 130 may provide a largest air cooling surface.

Figure 5:
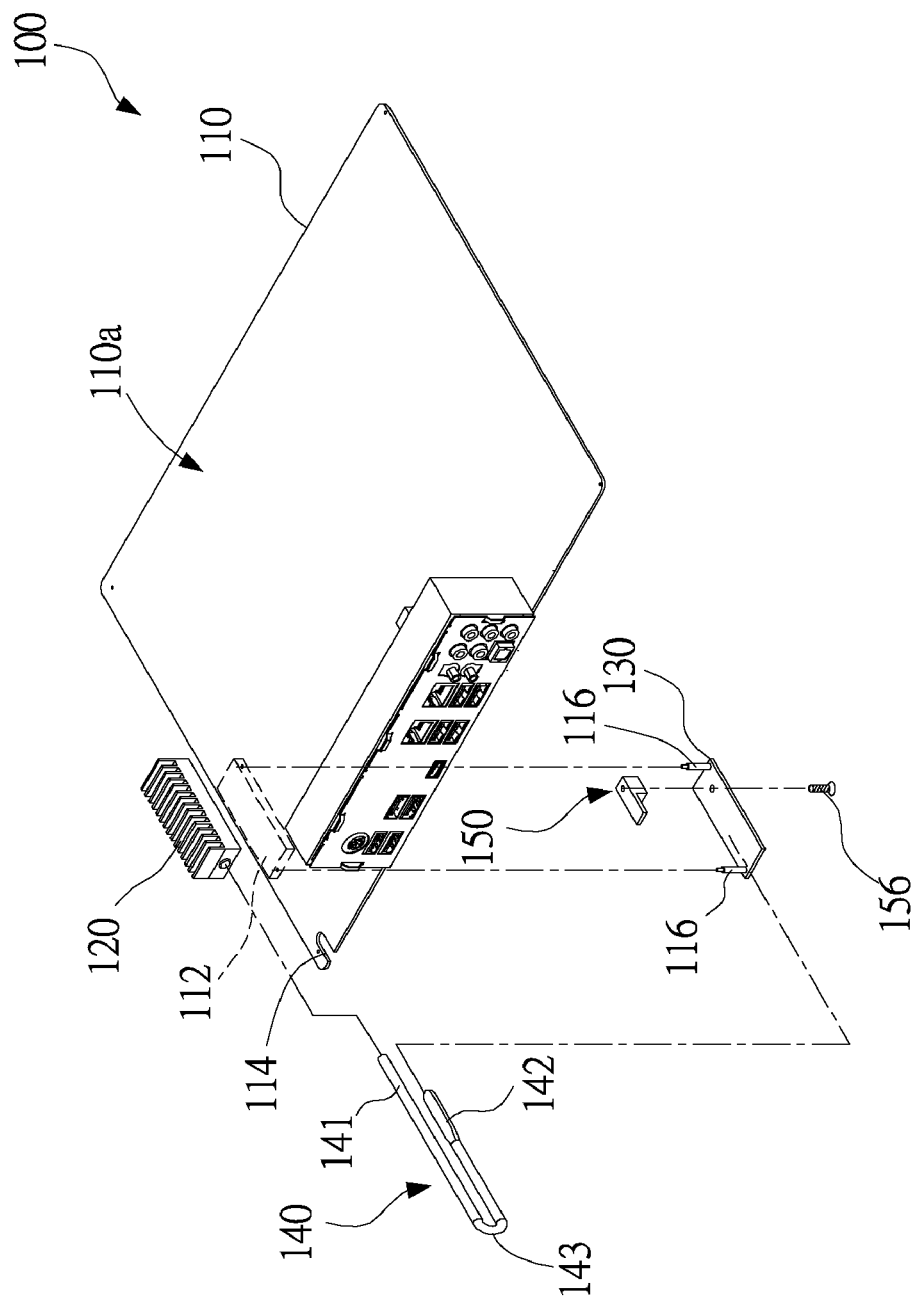
FIG. 5 is a three-dimensional exploded view according to another embodiment of this disclosure.

As shown in FIG. 5, in another embodiment, an area of the metal back plate 130 is less than an area of the circuit board 110, so that the metal back plate 130 only covers a part of the rear side 110b of the circuit board 110. In this case, the heat sink 120 and the metal back plate 130 may be correspondingly disposed, so that a projection of the metal back plate 130 on the circuit board 110 overlaps a projection of the heat sink 120 on the circuit board 110. In this case, a design of the heat pipe 140 may be simplified, so that the shape of the heat pipe 140 is a common U-shape, and the lengths of the first end 141 and the second end 142 are the same.

Figure 6:
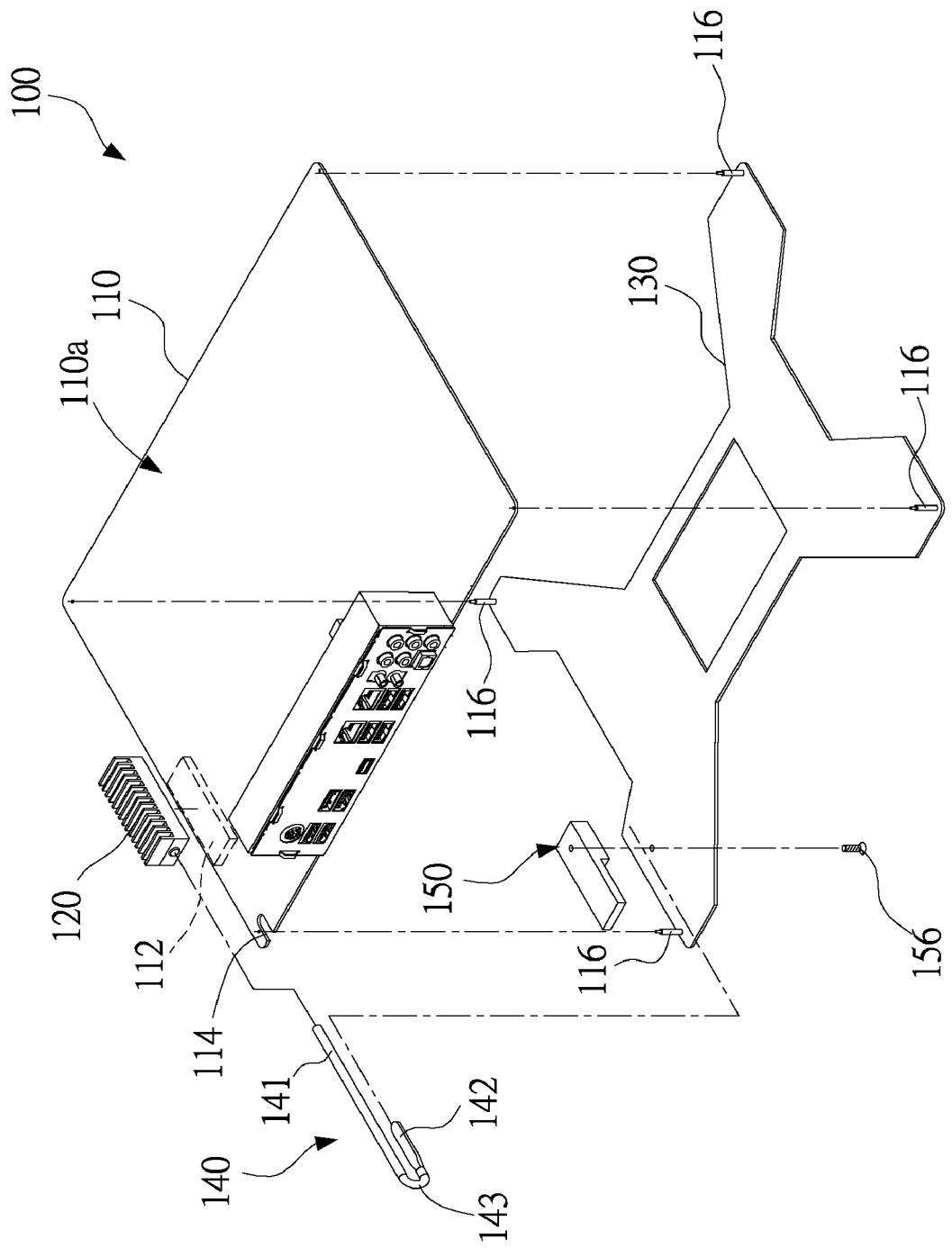
FIG. 6 is a three-dimensional exploded view according to still another embodiment of this disclosure.

As shown in FIG. 6, in still another embodiment, the area of the metal back plate 130 is less than the area of the circuit board 110, but the projection of the metal back plate 130 on the circuit board 110 does not necessarily overlap the projection of the heat sink 120 on the circuit board 110 completely. Particularly, the metal back plate 130 may be in an irregular shape and include a concave notch and an opening hole. The concave notch and the opening hole may expose a part of the rear side 110b of the circuit board 110, so that a heating point on the rear side 110b of the circuit board 110 is not covered by the metal back plate 130. In addition, the metal back plate 130 or the heat sink 120 are not limited to one. The circuit board heat dissipation assembly 100 may configure a plurality of metal back plates 130 or a plurality of heat sinks 120. The plurality of metal back plates 130 or the plurality of heat sinks 120 may be connected through the heat pipe 140. Then, one of the plurality of metal back plates 130 or the plurality of heat sinks 120 is selected to be connected through the heat pipe 140.

After the heat sink 120 absorbs heat in the heat generating area 112, the heat sink 120 not only dissipates heat by using its own heat dissipation function, but also transfers heat to the metal back plate 130 through the heat pipe 140, so that the metal back plate 130 can make use of a large surface area for air cooling, to strengthen the heat dissipation performance. In addition, the installation process can be simplified by using the pressing member 150 to connect the metal back plate 130 and the heat pipe 140, and the reliability of the pressing member 150 combined to the metal back plate 130 is improved.

What is claimed is:

1. A circuit board heat dissipation assembly, comprising:
 a circuit board, including a front side and a rear side, wherein the front side has at least one heat generating area;
 a heat sink, disposed in the heat generating area;
 a metal back plate, disposed at a spacing from the rear side of the circuit board;
 a heat pipe, including a first end, a bend segment, and a second end, wherein the first end is connected to the heat sink, the second end is in contact with the metal back plate, and the bend segment connects the first end and the second end at a side edge of the circuit board;
 a pressing member, including a fixed portion and a pressing portion extending from the fixed portion, wherein the pressing member and the second end of the heat pipe are located between the metal back plate and the circuit board, the fixed portion is configured to be fixed on the metal back plate, and the pressing portion is configured to press the second end; and
 a bolt, configured to pass through the metal back plate from an outer side surface of the metal back plate and be screwed into the fixed portion of the pressing member, so as to fix the fixed portion to the metal back plate;
 wherein the circuit board includes a notched groove located at the side edge of the circuit board, the notched groove is open at the side edge and extends toward the pressing member, and the bend segment passes through the notched groove.

2. The circuit board heat dissipation assembly as claimed in claim 1, further comprising a plurality of connecting columns, wherein the circuit board and the metal back plate are connected through the plurality of connecting columns.

3. The circuit board heat dissipation assembly as claimed in claim 1, wherein the metal back plate covers the entire rear side of the circuit board.

4. The circuit board heat dissipation assembly as claimed in claim 1, wherein the metal back plate covers a part of the rear side of the circuit board.

5. The circuit board heat dissipation assembly as claimed in claim 4, wherein a projection of the metal back plate on the circuit board overlaps a projection of the heat sink on the circuit board.

6. The circuit board heat dissipation assembly as claimed in claim 1, wherein the second end is flat and includes a first contact surface and a second contact surface respectively in contact with the pressing member and the metal back plate.

7. The circuit board heat dissipation assembly as claimed in claim 6, wherein a heat-conducting medium is disposed between the first contact surface and the pressing member, and/or a heat-conducting medium is disposed between the second contact surface and the metal back plate.

8. The circuit board heat dissipation assembly as claimed in claim 1, wherein the pressing member and the second end are located between the metal back plate and the circuit board.

9. The circuit board heat dissipation assembly as claimed in claim 1, wherein a thickness of the fixed portion is greater than the thickness of the pressing portion, a pressing space exists between the pressing portion and the metal back plate, and the second end is located in the pressing space.

* * * * *